United States Patent [19]

Moerbe et al.

[11] Patent Number: 5,137,455
[45] Date of Patent: Aug. 11, 1992

[54] ELECTRICAL CONNECTOR, PARTICULARLY FOR BRAKING CONTROL UNIT

[75] Inventors: Matthias Moerbe, Ilsfeld-Helfenberg; Walter Reichert, Schwieberdingen, both of Fed. Rep. of Germany

[73] Assignee: Robert Bosch GmbH, Stuttgart, Fed. Rep. of Germany

[21] Appl. No.: 578,722

[22] Filed: Sep. 6, 1990

[30] Foreign Application Priority Data

Sep. 9, 1989 [DE] Fed. Rep. of Germany ... 8910805[U]

[51] Int. Cl.$^5$ .............................................. H05K 7/06
[52] U.S. Cl. .................................... 439/34; 137/884; 303/119; 439/299
[58] Field of Search ............... 439/34, 76, 299, 300, 439/535, 540, 924; 361/392, 393, 394, 395, 399; 307/10.1, 147, 150; 137/351, 353, 884; 303/119, 113

[56] References Cited

U.S. PATENT DOCUMENTS

| | | | |
|---|---|---|---|
| 3,909,070 | 9/1975 | Leiber | 303/21 P |
| 4,180,803 | 12/1979 | Wesemeyer | 340/164 R |
| 4,355,853 | 10/1982 | Kourimsky | 439/83 |
| 4,504,911 | 3/1985 | Braschel | 364/426 |
| 4,629,259 | 12/1986 | Bräuninger | 303/109 |
| 4,685,753 | 8/1987 | Isshiki et al. | 439/62 |
| 4,769,557 | 9/1988 | Houf et al. | 307/147 |
| 4,794,269 | 12/1988 | Kawata et al. | 307/10.1 |
| 4,861,116 | 8/1989 | Bernhardt | 303/100 |
| 4,928,730 | 5/1990 | Ando et al. | 137/884 |
| 4,954,102 | 9/1990 | Ozaki et al. | 439/34 |
| 4,956,748 | 9/1990 | Yamamoto et al. | 439/34 |
| 5,000,226 | 3/1991 | Stoll et al. | 137/884 |
| 5,022,717 | 6/1991 | Heibel et al. | 439/34 |

FOREIGN PATENT DOCUMENTS 1590348  1/1981  United Kingdom ............... 439/717

Primary Examiner—Neil Abrams
Attorney, Agent, or Firm—Frishauf, Holtz, Goodman & Woodward

[57] ABSTRACT

An electrical connection structure for connecting an electronic control unit 7, for example in an anti-lock braking system (ABS) or a traction control system, to magnetic valves 2,3, or other load, features a novel plug-and-socket structure which eliminates some of the conventional wiring harness. Magnetic valves 2, 3 are attached on one side to a housing 4 and feature, on their opposing faces, prongs 6 which engage counter-contacts 18 on electronics unit 7, which thus attaches directly to the valve unit. Electronics unit 7 also has sockets to receive contact pins 22 of a relay 23. Electronics unit 7 and valve housing 4 mate in such a way that relay 23 cannot be accidentally unplugged and is protected from environmental influences.

5 Claims, 3 Drawing Sheets

ELECTRICAL CONNECTOR, PARTICULARLY FOR BRAKING CONTROL UNIT

Cross-Reference to related patents, the disclosures of which are hereby incorporated by reference:

| U.S. Pat. No. 3,909,070, | LEIBER, | Sep. 30, 1975; |
|---|---|---|
| U.S. Pat. No. 4,180,803, | WESEMEYER & HAUBNER, | Dec. 25, 1979; |
| U.S. Pat. No. 4,504,911, | BRASCHEL, JONNER & LEIBER, | Mar. 12, 1985; |
| U.S. Pat. No. 4,629,259, | BRAUNINGER, | Dec. 16, 1986; |
| U.S. Pat. No. 4,861,116, | BERNHARDT & WETZEL, | Aug. 29, 1989. |

FIELD OF THE INVENTION

The present invention relates generally to a device for electrical connection of an electricity-consuming unit with an electronics unit and, more particularly, to connection of a power end stage in an anti-lock braking system (ABS) or a traction control/drive train slip control system (ASR) in motor vehicles.

BACKGROUND OF THE INVENTION

In motor vehicle technology, it is known to design control devices, particularly in anti-lock braking systems and/or traction control systems, with a controlled energy-consuming unit or load and a controlling electronics unit which is a separate element amounted at a specific location (e.g. in the engine compartment under the hood). The electronics unit is connected with sensors by means of electrical plug-and-socket connections. Further, another plug-and-socket connection is provided which connects the electronics unit through a wiring harness to an energy-consuming unit at another location.

The wiring harness is connected to the consuming unit by another plug connection. The number of connections and contacts is relatively great and requires a correspondingly high investment. In the vehicle technology context, the incidence of vibrations, and the like, means that a high standard of safety and reliability must be satisfied.

THE INVENTION

The device of the present invention with its novel plug-and-socket structure has the advantage over the prior art that the connecting lines (wiring harness) and contacts can be reduced to a substantial extent. Since the connections of the load are formed as plug contacts and the electronics unit has the matching counter contacts, the electronics unit can be arranged directly on the load. That is, in the plug-connected state formed by the connected plug contacts or prongs and the counter contacts of the socket, the electronics unit and the load assume immediately adjacent positions. The electronics unit and the load thus form a "plug-connectable system". Thus, between these two modules, one can omit the conventionally used wiring harness, as well as one of the two plug and socket connections used on that conventional wiring harness. Since the electronics unit is preferably attached to the load by means of a plug connection, this not only assures the electrical connection, but also eliminates the need for additional mechanical structural elements, which were required in the prior art version in order to mount the electronics unit.

According to a further feature of the invention, one can also provide supplemental mechanical holding means in addition to the plug connection between the electronics unit and load. In particular, this increases the reliability of the continuous electrical contact. To the extent that the control device of the vehicle's electronics is a part of an anti-lock braking system and or of a drive train slip control system, the load comprises at least one magnetic valve.

Such a magnetic valve has a coil which regulates the valve flow cross section, depending upon the excitation of the coil. In an anti-lock braking system (ABS), multiple magnetic valves are provided in a so-called "hydro-aggregate" or valve assembly. The magnetic valves are interposed in hydraulic lines which carry brake fluid. Upon each actuation of the brakes of the vehicle, the pressure of the brake fluid in the braking system is specified, and the anti-lock braking system exerts its influence, in each individual case, by actuation of the magnetic valves. This actuation is generated with the aid of sensors, which means that the vehicle features sensors which detect the state of vehicle traction with the road, feed their data through an electronic evaluation unit to the electronic control unit, which represents a power output stage and in turn controls the magnetic valves forming the load. See the patents referenced at the beginning of this specification.

Preferably, the magnetic valve is fastened on an outer wall of a housing (the valve receiving housing of the (hydro-aggregate) and the valve is surrounded by a protective wall of the electronics unit which preferably extends to the aforementioned outer wall. By this means, the magnetic valve, when plugged to the electronic unit, is not only connected electrically, but in addition is mechanically protected against environmental conditions and the like. Together, the electronics unit and the load (together with the valve receiving housing) form a single compact unit.

As previously mentioned, the feeding of data to the electronics unit is necessary. This task is accomplished by a wiring harness which runs from the respective sensors and is connected to the electronics unit through a plug contact device. According to a preferred embodiment, a connecting element of the plug contact device is received within a cavity formed between the valve receiving housing and the electronics unit. Thus, the direct plugging of the electronics unit and load in accordance with the present invention enables not only reduction of the number of contacts, but also leads to formation of a "plug-in position" of the connecting element, so that this element rest in a protected position and no sealing devices are required, since the connecting element is securely received or "sandwiched" between the two modules. An accidental release of this plug connection cannot take place.

Preferably, the connecting element is releasably held in correct position on the valve-receiving housing. This alignment assures that, upon plugging in of the electronics unit, the contacts of the connecting element assume the correct position with respect to the corresponding counter-contacts. In particular, one can provide mechanical means which inhibit assembly of the electronics unit with the consuming unit when the connecting element is incorrectly positioned, thus making assembly "idiot-proof".

Preferably, the mounting of the connecting element is accomplished by insertion into a positioning channel, and holding in the positioning channel is done with a dovetail connection which limits the depth of insertion. This dovetail connection directs the connecting element sidewise and the insertion limitation determines the position of the connecting element in the insertion direction, normal to sidewise direction.

As previously discussed, the connecting element extends from a wiring harness. The connecting element may be either a plug element or a socket element, with the electronic unit having the corresponding mating counter-contacts. At least a portion of the cross-section of the wiring harness preferably extends into a receiving recess of the electronics unit. This achieves cable guidance and eliminates cable fastening points. The space between the receiving recess and the electronics unit is preferably so dimensioned that clamping of the wiring harness occurs, thereby providing strain relief.

There is the further possibility of forming additional cavities between the valve-receiving housing and the electronics unit, in order to accommodate plug-in relay units or the like. These relays or similar components are thus located in a "plugged" position where they are protected against moisture, dust, vibration, electromagnetic interference, or similar noxious environmental influences. The cavity can be dimensioned to assure a slip-proof position. Accidental slippage out of the socket therefore cannot occur.

DRAWINGS

DETAILED DESCRIPTION

Figure 1:
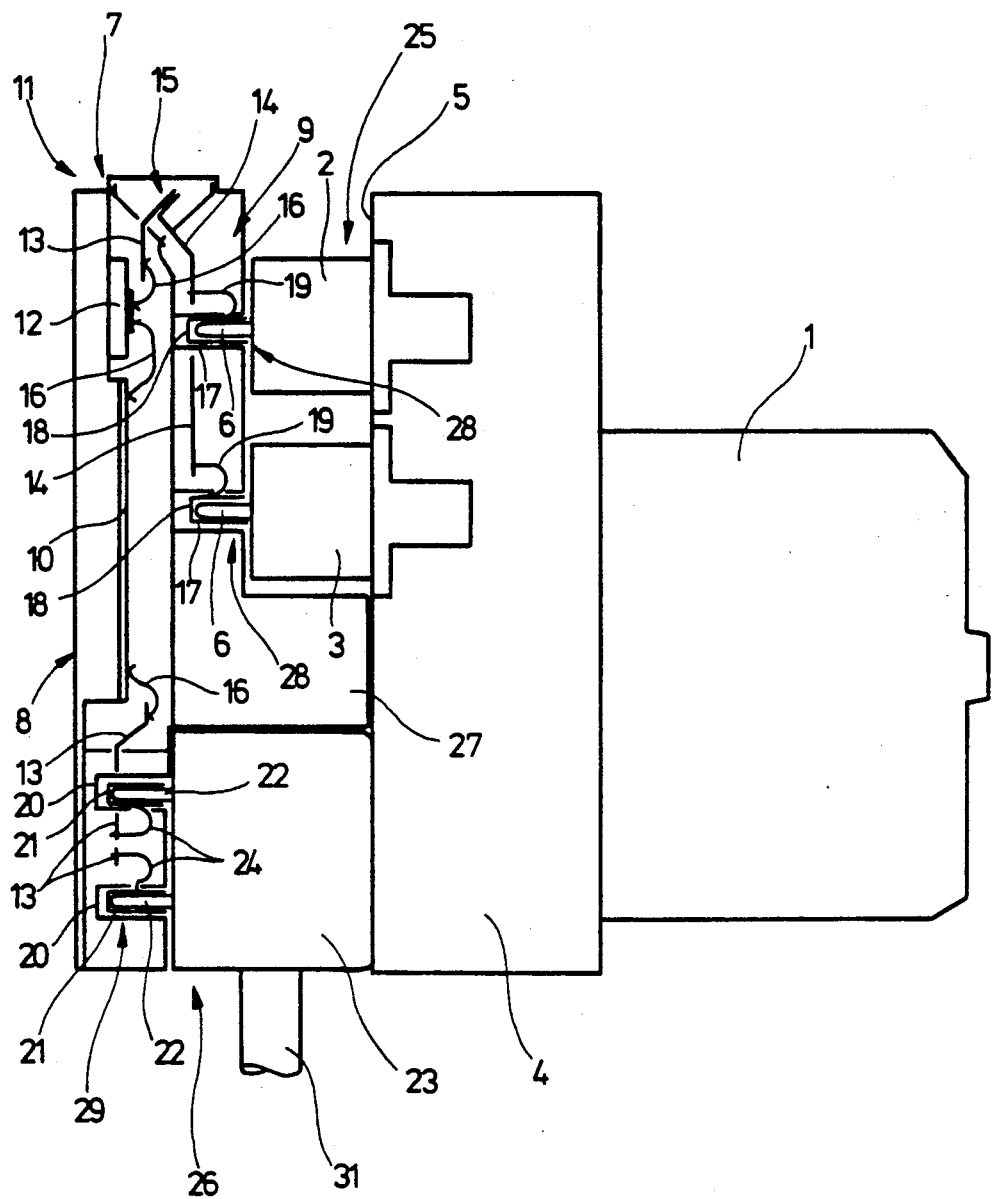
FIG. 1 is a schematic cross-sectional view of the electrical connection arrangement of the present invention used in an ABS (Anti-lock Braking System) control device.

FIG. 1 illustrates an apparatus which is part of an anti-lock braking system (ABS) of a motor vehicle. It includes an engine or motor 1, which drives a pump (not shown). This pump furnishes hydraulic fluid (brake fluid) through corresponding hydraulic lines (also not shown) in which magnetic valves 2, 3 are interposed. These magnetic valves 2 and 3 each have a respective coil which regulates the valve flow cross section depending upon their excitation, so that the flow of brake fluid furnished by the pump and flowing through the hydraulic lines can be influenced or regulated. The magnetic valves 2 and 3 are fastened onto a valve receiving housing 4 on an outer wall 5. Preferably, the valve receiving housing 4 also encloses the aforementioned pump.

Magnetic valves 2 and 3 each have a respective attachment side adjacent housing 4 and each valve has a respective attachment-remote side, provided with terminals in the form of plug contacts or prongs 6.

FIG. 1 further shows an electronics unit 7 in the form of a power output stage, which serves to control the magnetic valves 2 and 3 which form the load or electricity-consuming unit. Electronics unit 7 has a base housing 8 on which a cover 9 is fastened. Electronics unit 7 is preferably made using hybrid technology. It comprises, among other elements, an electronic circuit 10 within base housing 8. Along an edge region 11 of base housing 8 are arranged power semiconductors 12, preferably power integrated circuits. In addition, contact strips 13 and 14 are arranged respectively in base housing 8 and in cover 9. Upon assembly of base housing 8 and cover 9, contact strips 13 are welded to contact strips 14, as indicated generally by arrow 15. Electronic circuit 10 is connected to power semiconductors 12 and/or contact strips 13 by means of bonded, welded or soldered leads 16. The same applies to the electrical connection of power semiconductor 12 with contact strips 13.

Cover 9 of the electronics unit 7 is formed with recesses 17 in which are mounted counter contacts or jacks 18 which mate with plug contacts or prongs 6. Counter contacts 18 are connected with contact strips 14 through wires or springy terminals 19.

Base housing 8 is also formed with receiving recesses 20 in which contacts 21 are located. Contact pins 22 of a relay 23 stick into contacts 21. Contacts 21 are connected through wires 24 with contact strips 13.

The apparatus is thus structured in such a manner that, upon plugging in of electronic unit 7, it assumes a position which is immediately adjacent to the consuming units (magnetic valves 2 and 3). The form of the hollow cover 9 is chosen such that cavities 25 and 26 are left between the mounted electronics unit 7 and the valve receiving housing 4. Cavity 25 receives magnetic valves 2 and 3 and cavity 26 receives relay 23. Cover 9 is supported on outer wall 5 of valve receiving housing 4 by means of the cover's projection 27. In the assembled state of the plug/socket connection 28, formed by plug contact 6 and counter contacts 18, the electronics unit 7, the magnetic valves 2 and 3, and the valve receiving housing 4 form a single compact unit. Relay 23 assumes a secure position in cavity 26 and is thus protected against slippage out of a socket 29 containing contacts 21.

Figure 2:
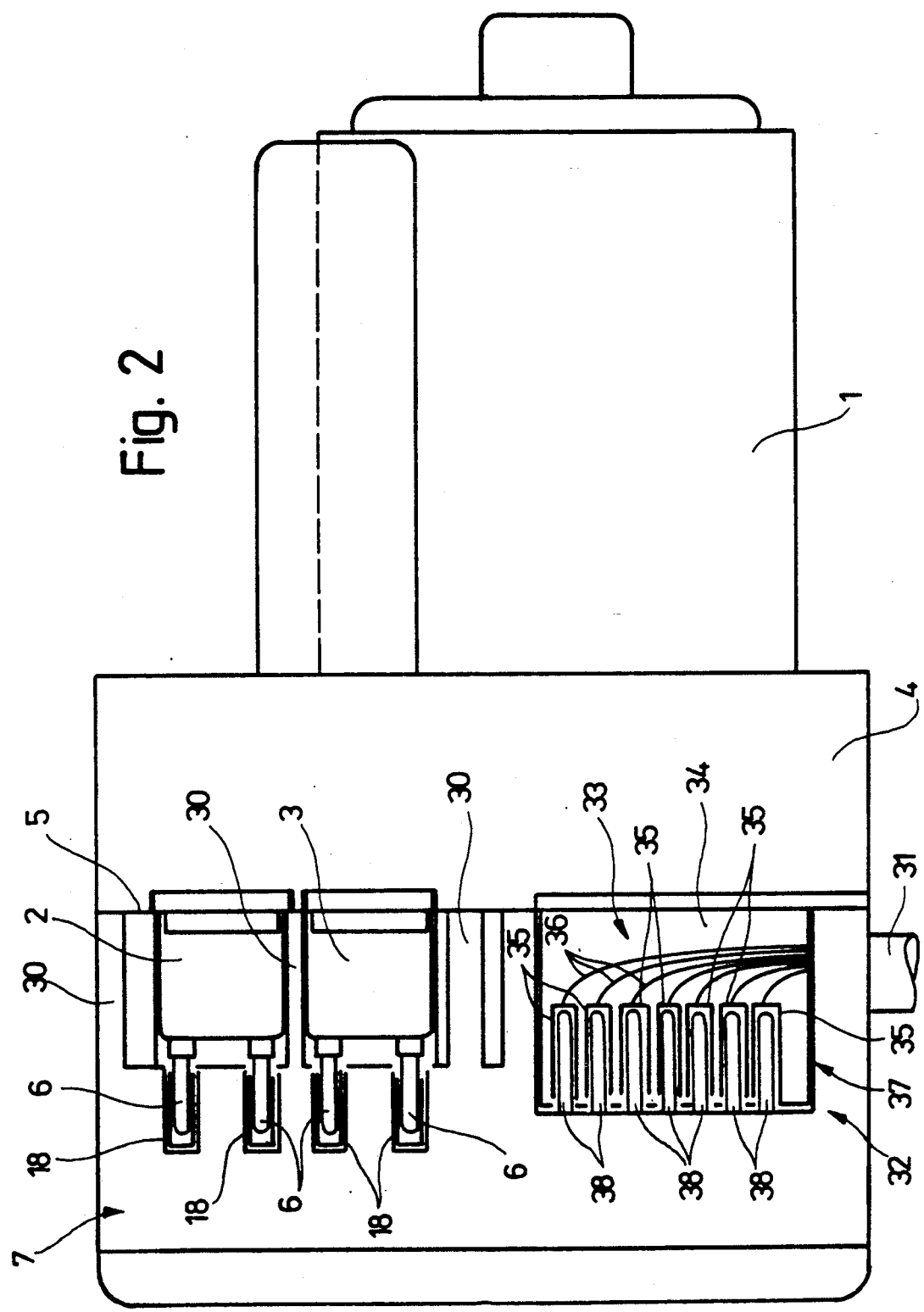
FIG. 2 is a schematic cross section of a further embodiment with a plug contact arrangement, by means of which a wiring harness is connected to an electronics unit.

FIG. 2 illustrates an alternative embodiment of the invention, according to which in contrast to the embodiment of FIG. 1, magnetic valves 2 and 3 each have two plug contacts 6. With each of these plug contacts 6, a corresponding number of counter contacts 18 is associated. Electronics unit 7 has protective walls 30 which extend to outer wall 5 of valve receiving housing 4 and thus surround magnetic valves 2 and 3. In this manner, magnetic valves 2 and 3 are encapsulated and protected from external influences. In general, the structure of the embodiment of FIG. 2 corresponds to that of FIG. 1.

FIG. 2 clearly illustrates that a wiring harness 31 is connected with the electronics unit 7 through a plug contact arrangement 32. This plug contact arrangement 32 is located, in the FIG. 1 embodiment, behind relay 23 and is thus not visible there. FIG. 2, in contrast, clearly illustrates its structure. The wiring harness features a connecting element 33, formed as a sleeve element 34. This features multiple contact bushings 35 in a corresponding number of receiving recesses (not shown). Elements 35 are connected to arteries 36 of the leads within wiring harness 31. Electronics unit 7 is formed with a cavity 37 into which counter contacts 38 project. Connecting element 33 is held on valve receiving housing in a correct position such that, upon assembly of electronics unit 7 and valve receiving housing 4, the contact bushings 35 connect with counter contacts 38. Thus, assembly of electronics unit 7 with valve receiving housing 4 assures not only the electrical connection to magnetic valves 2 and 3, but also the connection to the wiring harness 31. Furthermore, cavity 37 acts to protect connecting element 33 against accidental disconnection.

Figure 3:
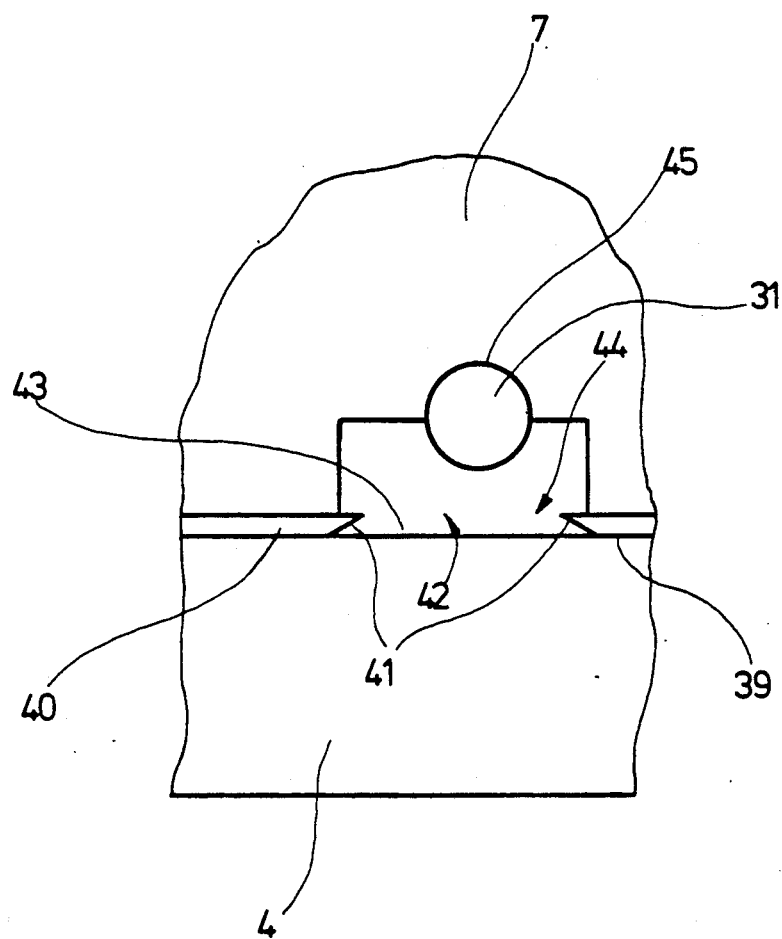
FIG. 3 is a cross section through a connecting element of the plug contact device.

FIG. 3 illustrates that connecting element 33 can be fastened releasably and in correct position on valve receiving housing 4. For this purpose, valve receiving housing 4 features, on its outer surface 39, a mounting plate 40 having beveled facing surfaces 41. Mounting plate 40 is mechanically connected with valve receiving housing 4. A positioning channel 42 is formed between the beveled facing surfaces 41. An appropriately shaped portion 43 of connecting element 33 engages in positioning channel 42. Positioning channel 42 thus serves for insertion of portion 43 of connecting element 33, so that the beveled surfaces 41 create a dovetail connection 44. The structure thus provides that the insertion path of connecting element 33 is limited in order to assure a correctly positioned mounting.

During assembly, initially connecting element 33 is inserted in positioning channel 42 in the correct position. Further, to the extent provided, relays are stuck into the corresponding sockets 29 of electronics unit 7. Finally, electronics unit 7 is plugged into place, thereby completing the electrical connection to magnetic valves 2 and 3 and, via connecting element 33, to the wiring harness 31.

FIG. 3 illustrate that electronics unit 7 features a receiving recess 45 into which wiring harness 31 is received with a portion of its cross section. This serves to relieve any pulling or tension loads on the wiring.

Various modifications are possible within the scope of the inventive concept and, in particular, features of one embodiment may be combined with features of another embodiment.

We claim:

1. Apparatus for secure electrical connection of an electronic control and power output unit (7) to a power consuming unit (2,3) in a motor vehicle, wherein said consuming unit comprises at least one magnetically actuated hydraulic valve (2,3);

said consuming unit (2,3) has plug contacts (6);

said electronic unit (7) has mating counter-contacts (18);

said electronic unit and consuming unit plug together at a plug/socket connection (28) and assume positions immediately adjacent one another;

and wherein said at least one valve (2,3) is mounted on an outer wall (5) of a valve-receiving housing (4), and said electronics unit (7) has a protective wall (30) which extends to said outer wall and surrounds said at least one valve.

2. Apparatus according to claim 1, wherein said housing (4) and said electronic unit (7) form therebetween a cavity (37) which accommodates a connecting element (33) of a plug-contact device (32) for connection to the electronic unit.

3. Apparatus according to claim 2, wherein the connecting element (33) is releasably mounted in correct alignment on said valve-receiving housing (4).

4. Apparatus according to claim 3, wherein a positioning channel (42) is formed in said electronic unit (7) for insertion of said connecting element (33).

5. Apparatus for secure electrical connection of a controlling electronic control and power output unit (7) to a controlled power consuming unit (2,3) in a motor vehicle, wherein the consuming unit comprises at least one magnetically actuated hydraulic valve (2,3);

the consuming unit (2,3) has plug contacts (6);

the electronic unit (7) has mating counter-contacts (18); and said electronic unit and consuming unit plug together at a plug/socket connection (28) and assume positions immediately adjacent one another; and wherein said electronic unit (7) and consuming unit plug together with a pluggable switch means (23) interposed therebetween, and thereby secure said switch means against accidental disconnection.

* * * * *